(12) United States Patent
Kashiwagi et al.

(10) Patent No.: US 7,710,031 B2
(45) Date of Patent: May 4, 2010

(54) LENS ARRAY SHEET

(75) Inventors: Motofumi Kashiwagi, Tokyo (JP);
Kenji Kusano, Tokyo (JP)

(73) Assignee: Zeon Corporation, Tokyo (JP)

( * ) Notice: Subject to any disclaimer, the term of this patent is extended or adjusted under 35 U.S.C. 154(b) by 524 days.

(21) Appl. No.: 10/524,117

(22) PCT Filed: Aug. 12, 2003

(86) PCT No.: PCT/JP03/10255

§ 371 (c)(1),
(2), (4) Date: Feb. 10, 2005

(87) PCT Pub. No.: WO2004/017106

PCT Pub. Date: Feb. 26, 2004

(65) Prior Publication Data

US 2005/0212989 A1 Sep. 29, 2005

(30) Foreign Application Priority Data

Aug. 13, 2002 (JP) .............................. 2002-236040

(51) Int. Cl.
*H05B 33/22* (2006.01)
(52) U.S. Cl. ....................... 313/512; 313/504
(58) Field of Classification Search ......... 313/498–512; 315/169.3; 345/36, 45, 76; 428/64.1
See application file for complete search history.

(56) References Cited

U.S. PATENT DOCUMENTS

| | | | | |
|---|---|---|---|---|
| 5,714,218 A | * | 2/1998 | Nishio et al. ............... | 428/64.1 |
| 6,421,104 B1 | * | 7/2002 | Richard ........................ | 349/63 |
| 6,447,879 B1 | * | 9/2002 | Sakurai et al. ............... | 428/161 |
| 6,997,595 B2 | * | 2/2006 | Mi et al. ...................... | 362/626 |
| 7,011,420 B2 | * | 3/2006 | Cok ............................. | 362/84 |
| 2001/0033135 A1 | | 10/2001 | Duggal et al. | |
| 2002/0094422 A1 | | 7/2002 | Tsai et al. | |
| 2003/0020399 A1 | * | 1/2003 | Moller et al. ................ | 313/504 |
| 2003/0086030 A1 | * | 5/2003 | Taniguchi et al. ............. | 349/61 |

FOREIGN PATENT DOCUMENTS

| | | |
|---|---|---|
| EP | 0 969 699 A1 | 1/2000 |
| EP | 1 122 559 A2 | 8/2001 |
| JP | 6-308485 A | 11/1994 |
| JP | 7-8805 A | 2/1995 |
| JP | 7-114025 A | 5/1995 |
| JP | 7-318918 | 12/1995 |
| JP | 8-271888 A | 10/1996 |
| JP | 8-278413 A | 10/1996 |

(Continued)

OTHER PUBLICATIONS

Supplementary European Search Report dated Feb. 13, 2008 issued in corresponding Application No. 03788087.9-1524 PCT/JP0310255.

*Primary Examiner*—Nimeshkumar D. Patel
*Assistant Examiner*—Christopher M Raabe
(74) *Attorney, Agent, or Firm*—Westerman, Hattori, Daniels & Adrian, LLP

(57) ABSTRACT

A lens array sheet having a plurality of pyramid-shaped projections or recesses on a surface of its transparent base material film, particularly suitable to be used as a light condensing plate of an organic electroluminescence element is provided.

9 Claims, 6 Drawing Sheets

FOREIGN PATENT DOCUMENTS

| | | |
|---|---|---|
| JP | 9-68605 | 3/1997 |
| JP | 9-323354 | 12/1997 |
| JP | 9-326297 | 12/1997 |
| JP | 10125123 A * | 5/1998 |
| JP | 11-245266 A | 9/1999 |
| JP | 2000-068069 A | 3/2000 |
| JP | 2000-75102 A | 3/2000 |
| JP | 2000-148032 A | 5/2000 |
| JP | 2001-4442 | 1/2001 |
| JP | 2002-207434 A | 7/2002 |
| WO | WO 2003/007663 A1 | 1/2003 |

* cited by examiner

LENS ARRAY SHEET

FIELD OF THE INVENTION

The present invention relates to a lens array sheet suitable to a light condensing plate used for a display device of an organic electroluminescence element and liquid crystal, etc., a mold suitable for being used for producing the lens array sheet, a light condensing plate composed of the lens array sheet, an organic electroluminescence illuminant comprising the lens array sheet, and a display device comprising the illuminant.

BACKGROUND ART

There are demands for a surface lighting device used for a display device to have many characteristics, such as high luminance, low power consumption and thin shape. When improving one of these characteristics, it is liable that other performance has to be more or less sacrificed and it has been very difficult to improve all performances at a time.

To overcome the plurality of challenges, a sheet (lens array sheet) having a lens array formed with a fine concave and convex pattern, such as a prism shape and a Fresnel lens shape, on a surface of a thermoplastic resin mold, such as a transparent plastic, has been increasingly used as an optical part in recent years.

For example, a method of easily attaining high luminance by using a lens array sheet as a light condensing plate for a liquid crystal display device and condensing a display light in an approximately normal direction has become widely used. This method uses a light condensing effect of a prism and is capable of attaining high luminance without increasing an electric power and a thickness of the device, while it has a disadvantage that the luminance drastically declines when being out of the light condensing range.

To solve such a disadvantage, the Japanese Unexamined Patent Publication No. 7-261006 proposes to change a refraction index between one surface and the other surface of the prism. Also, the Japanese Unexamined Patent Publication No. 2000-75102 proposes to use as a material of the light condensing plate an alicyclic structure containing thermoplastic resin having a norbornene structure.

Since an organic electroluminescence material can be used as a thin film, it is an effective material for making a surface lighting device and a display device thinner and lighter. However, light transmittance of a liquid crystal panel is too low to use it as a backlight of a liquid crystal display device, therefore, the light condensing efficiency has to be furthermore improved comparing with that in a conventional backlight using a cold-cathode tube, etc.

However, when using a prism lens having a line shaped surface, which has been conventionally used as a light condensing plate of a liquid crystal substrate, as a light condensing plate of an organic electroluminescence element, there is a disadvantage that the viewing angle becomes narrow.

SUMMARY OF THE INVENTION

An object of the present invention is to provide a lens array sheet having a wide viewing angle and an improved light condensing efficiency, a mold suitable for being used for producing the lens array sheet, a light condensing plate comprising the lens array sheet, an organic electroluminescence element comprising the lens array sheet, and a display device comprising the element.

The present inventors confirmed that a line shaped prism lens converges a light only in one direction and that the disadvantages explained above arise. As a result that they have been committed themselves to study for attaining an improvement in light convergence, they found that a lens array sheet having pyramid-shaped projections and recesses is capable of most effectively condensing even a light from an organic electroluminescence element comparing with ones having projections and recesses in a three-sided pyramid, six-sided pyramid, eight-sided pyramid or conical shape, so that the present invention has completed.

According to the present invention, there is provided a lens array sheet having a plurality of pyramid-shaped projections or recesses on a surface of its transparent base material film.

Preferably, a bottom surface of the pyramid shape is a rectangular or square shape satisfying a relationship of (length "a" of one side)$\leqq$(length "b" of other side)$\leqq$10a.

Preferably, the length "a" of one side of the bottom surface of the pyramid shape is 0.1 μm to 20 μm.

Preferably, a height "c" of the pyramid shape is $0.2a \leqq c \leqq 2a$ with respect to the length "a".

Preferably, a width "s" between adjacent projections or recesses is not more than 50% of the length "a".

Preferably, a base angle θ of side surfaces of the pyramid shape is 20° to 80°.

Preferably, the transparent base material film is composed substantially of an alicyclic olefin resin. The expression "composed substantially of a transparent resin material" means the case of composing all by a transparent resin material and the case of including various additives in accordance with need as far as it is not more than 50 wt % or so with respect to the total amount.

Preferably, the alicyclic olefin resin is a norbornene based polymer or a vinyl alicyclic hydrocarbon polymer.

Preferably, the lens array sheet is produced by injection molding using a mold having pyramid-shaped projections or recesses on its surface.

According to a first aspect of the present invention, there is provided a mold, made by a metal layer and provided with pyramid shaped projections on its surface, wherein said metal layer is obtained by forming a metal layer on said pattern of a substrate formed with a pyramid-shaped concave pattern and peeling the metal layer form the substrate. In the first aspect, it is preferable to use as the substrate formed with a pyramid-shaped concave pattern a mold made by silicon formed by (1) a step of forming a positive type resist pattern on a silicon wafer formed on its surface with an silicon oxide layer, (2) a step of forming a silicon oxide pattern by performing etching on the silicon oxide layer by an etching solution containing hydrofluoric acid by using the resist pattern as a mask, (3) a step of removing the resist pattern and performing anisotropic etching on the silicon wafer surface by an alkaline solution to form pyramid-shaped recesses, and (4) a step of removing the silicon oxide pattern by an etching solution containing hydrofluoric acid.

According to a second aspect of the present invention, there is provided a mold made by a metal layer and provided with pyramid shaped projections on its surface, wherein said metal layer is obtained, by using the mold as set forth in claim 10 or 11, by forming a metal layer on a surface of the mold and peeling the metal layer from the mold.

According to the present invention, there is provided a light condensing plate composed of the above lens array sheet.

According to the present invention, there is provided an organic electroluminescence element, comprising a transparent substrate composed of the above lens array sheet, a transparent electrode layer stacked on the transparent substrate, an organic electroluminescence material layer stacked on the transparent electrode layer, and a metal electrode layer stacked on the organic electroluminescence material layer.

According to the present invention, there is provided a display device comprising the above organic electroluminescence element.

Figure 1A:
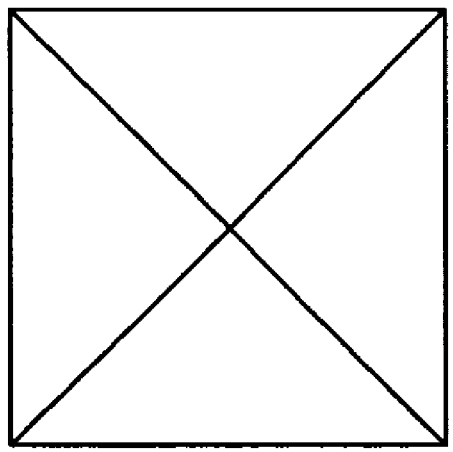
FIG. 1A, FIG. 2A, FIG. 3A and FIG. 4A are plan views of examples of a pyramid shape.
Figure 1B:
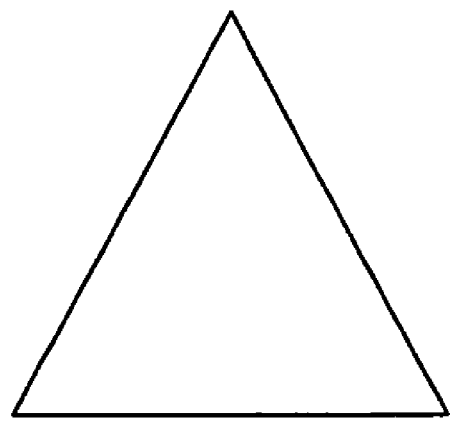
FIG. 1B, FIG. 2B, FIG. 3B and FIG. 4B are views from the front of the respective examples in FIG. 1A, FIG. 2A, FIG. 3A and FIG. 4A.
Figure 2A:
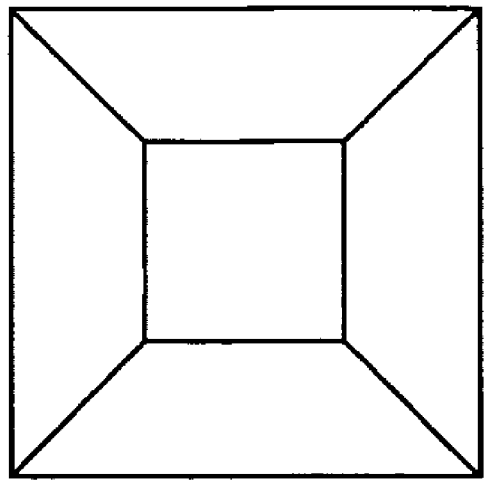
Figure 2B:
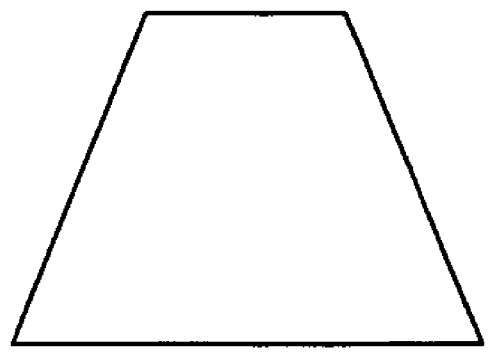
Figure 3A:
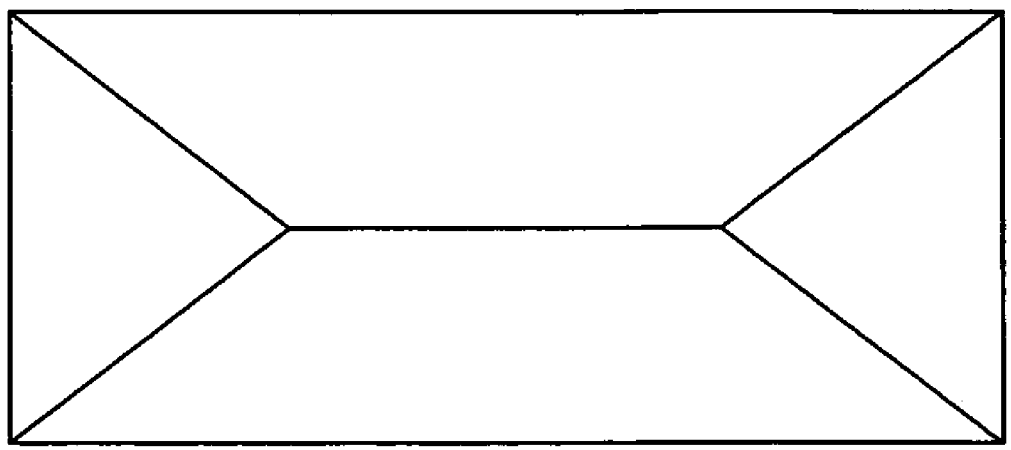
Figure 3B:
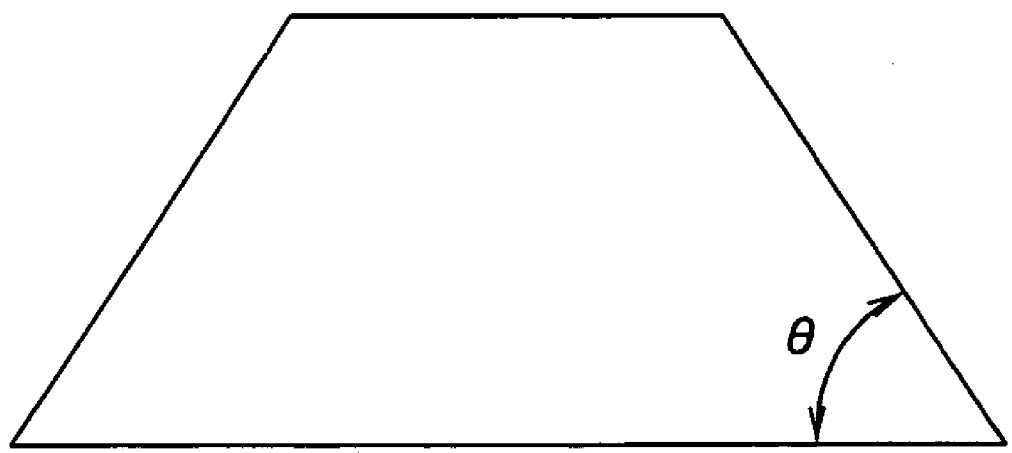
Figure 4A:
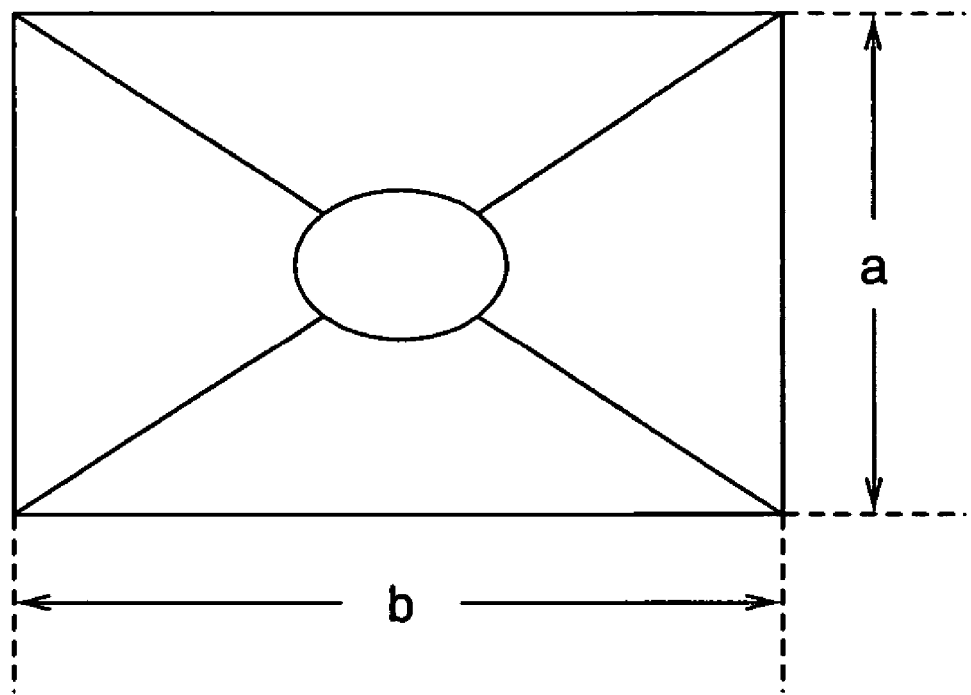
Figure 4B:
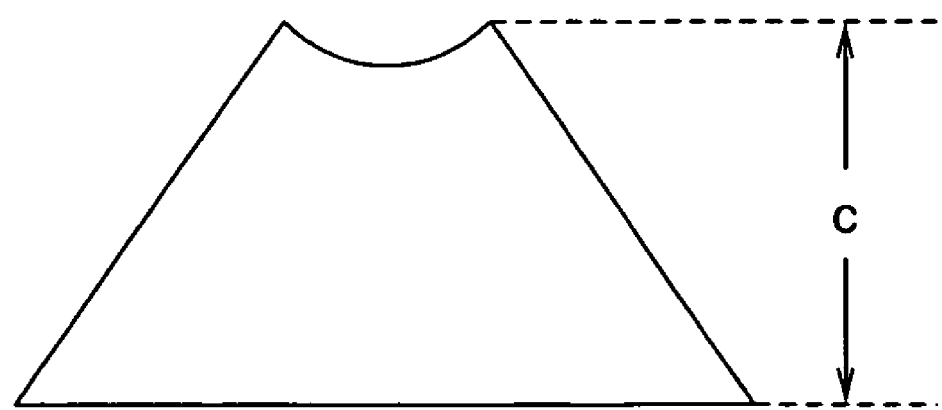

Note that as to references in the drawings, "a" indicates a length of a side forming a bottom surface of a pyramid shape, "b" indicates a length of other one side forming the bottom surface of the pyramid shape, "c" indicates a height of pyramid-shaped projections or recesses, θ indicates a base angle of side surfaces of the pyramid shape, 1 indicates pyramid-shaped projection or recess, 2 indicates a lens array sheet, and "s" indicates a width between pyramid shaped projections or recesses.

DESCRIPTION OF THE PREFERRED EMBODIMENT

Below, the present invention will be explained based on embodiments shown in drawings.

Lens Array Sheet

A lens array sheet of the present invention has pyramid-shaped projections or recesses on a surface (preferably, on one surface) of a transparent base material film.

Transparent Base Material Film

A transparent base material film to be used in the present invention is a film shaped mold composed substantially of a transparent resin material. The expression "composed substantially of a transparent resin material" means the case of composing all by a transparent resin material and the case of including various additives in accordance with need as far as it is not more than 50 wt % or so with respect to the total amount.

As specific examples of the transparent resin material, polyethylene, polypropylene, polymethylpentene and other linear polyolefin resins; polystyrene and other aromatic vinyl based resins; a norbornene based polymer, a vinyl alicyclic hydrocarbon polymer, a monocyclic olefin based polymer, a cyclic diolefin based polymer and other alicyclic olefin resins; polycarbonate, polyethylene phthalate, polybutylene phthalate, liquid crystal polyester and other polyester based resins; polymethyl methacrylate and other acrylic resins; an acrylonitrile styrene resin, an acrylonitrile styrene butadiene resin and other acrylonitrile based resins; polysulfone, polyether sulfone, polyphenylene sulfide, polyphenylene ether and other polyether based resins; and polyether ether ketone and other ketone based resins; may be mentioned.

Among them, a linear polyolefin resin, an alicyclic olefin resin and polyether based resin, etc. are preferable because they easily bring cross-linking reaction by irradiation of an active energy beam and solubility in specific solvents easily changes. Furthermore, an alicyclic olefin resin is the most preferable because of less absorption of visible light and a low water-absorbing property.

As specific examples of an alicyclic olefin resin, a ring-opened polymer of a norbornene based monomer and the hydrogenated product, a ring-opened polymer of other monomer capable of copolymerizing with a norbornene based monomer and the hydrogenated product, an addition polymer of a norbornene based monomer and the hydrogenated product, an additional copolymer with other monomer capable of copolymerizing with a norbornene based monomer and the hydrogenated product and other norbornene based polymers; polyvinylcycloalkane, polyvinylcycloalkene, hydrogenated product of an aromatic vinyl polymer and other vinyl alicyclic hydrocarbon polymer; polycyclopentene, polycyclohexene and other monocyclic olefin based polymers; polycyclohexadiene and other cyclic diolefin based polymers; etc. may be mentioned. Among them, a norbornene based polymer and a vinyl alicyclic hydrocarbon polymer are the most preferable. Also, a vinyl alicyclic hydrocarbon polymer may be a copolymer with other monomer (for example, butadiene, isoprene and other vinyl based monomers, etc.) capable of copolymerizing with vinylcycloalkane, vinylcycloalkene and an aromatic vinyl based monomer, etc., and the polymer form may be either of a block polymer and a random polymer.

A thickness of the transparent base material film is normally 0.05 to 3 mm or so.

Pyramid-Shaped Projections or Recesses

Projections or recesses on a surface of the transparent base material are pyramid shaped.

The projections or recesses may have a pyramid shape having different base angles of side surfaces or a right pyramid shape wherein all of the bottom angles are the same. Alternately, it may be a pyramid shape wherein an apex angle is cut off. Specifically, shapes shown in FIG. 1A, FIG. 1B, FIG. 2A, FIG. 2B, FIG. 3A, FIG. 3B, FIG. 4A and FIG. 4B are the examples but it is not limited to these.

Also, in terms of improving front luminance by improving the light condensing property, it is preferable that the bottom surface of the pyramid shape is a rectangular or square shape satisfying the relationship below. The relationship is preferably (length "a" of one side)≦(length "b" of other side)≦10a, more preferably (length "a" of one side)≦(length "b" of other side)≦5a, further preferably (length "a" of one side)≦(length "b" of other side)≦2a, particularly preferably (length "a" of one side)≦(length "b" of other side)≦1.5a.

The length "a" of one side of the bottom surface of the pyramid shape is not particularly limited but is normally 0.1 μm to 500 μm, preferably 0.1 μm to 100 μm. Particularly in the case of obtaining an organic electroluminescence element by using a lens array sheet of the present invention as a light condensing plate and using it as a backlight of a liquid crystal display device, the length "a" is preferably 0.1 μm to 20 μm, so that the liquid crystal is capable of preventing interference by an outside light (so-called moiré).

The base angle θ of side surfaces of the pyramid shape is preferably 20° to 80°, particularly preferably 30° to 75°.

A height "c" of the pyramid shape (a length from the bottom surface to the apex angle) is not particularly limited and is preferably $0.2a \leqq c \leqq 2a$, more preferably $0.5a \leqq c \leqq 1.5a$ with respect to the length "a" of one side of the bottom surface of the pyramid shape.

Figure 5A:
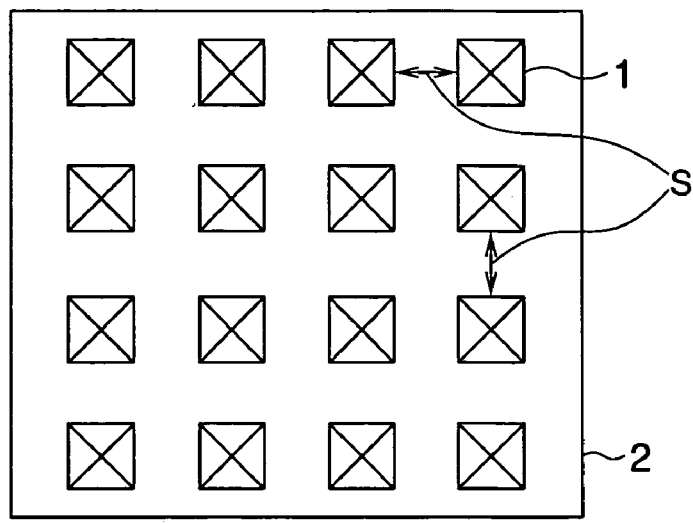
FIG. 5A, FIG. 5B and FIG. 5C are plan views showing examples of pyramid-shaped projections or recesses formed on a transparent base material film.
Figure 5B:
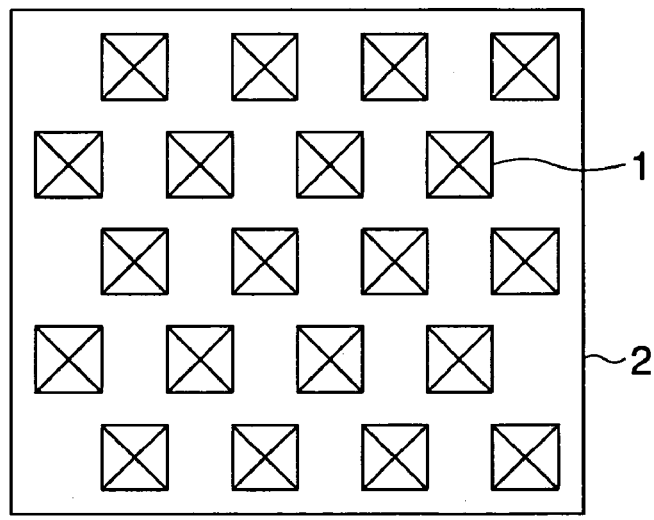
Figure 5C:
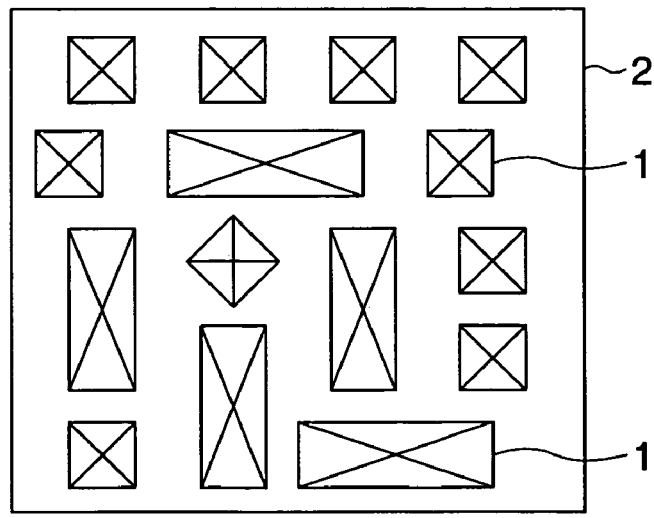
Figure 6A:
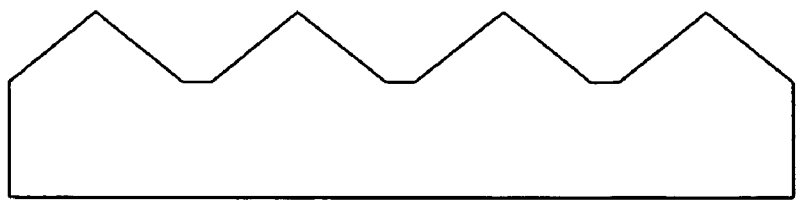
FIG. 6A and FIG. 6C are sectional views of examples of pyramid-shaped projections or recesses formed on a transparent base material film, wherein the projections or recesses are formed to be in a regular lattice shape.
Figure 6B:
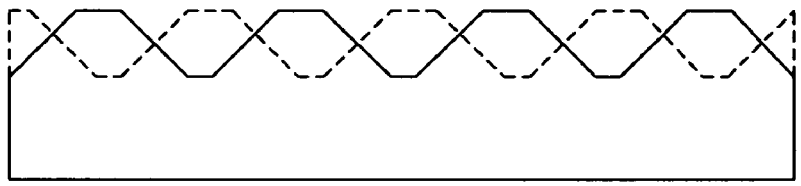
FIG. 6B and FIG. 6D are sectional views of examples of pyramid-shaped projections or recesses formed on a transparent base material film, wherein the projections or recesses are formed to be in a hound's-tooth check shape (note that a dotted line indicates pyramid-shaped projections or recesses on the next line).
Figure 6C:
Figure 6D:

It is sufficient when a large number of the projections and recesses as above are arranged on a surface of a transparent base material film, and directions of the respective projections and recesses may be a regular lattice shape as shown in FIG. 5A, a hound's-tooth check shape as shown in FIG. 5B, or a random shape as shown in FIG. 5C. A regular lattice shape or hound's-tooth check shape is preferable for obtaining higher luminance.

Also, a shape of the respective projections or recesses arranged on the surface of the transparent base material film may be all same or independent shapes from one another.

Production Method of Lens Array Sheet (Formation Method of Projections or Recesses)

A method of forming pyramid-shaped projections or recesses on a surface of the transparent base material film is not particularly limited. As typical techniques, for example, (1) a method of setting a mold formed with pyramid-shaped projections or recesses to perform injection molding, compression molding or heat-melt molding, such as blow molding, (2) a method of using a die formed with pyramid-shaped projections or recesses to perform melt extrusion molding, (3) a so-called 2P method for applying an ultraviolet ray curing resin on a molding surface formed with pyramid-shaped projections or recesses, then, curing the resin by irradiating an ultraviolet ray to transfer a pattern, may be mentioned. Among them, a method of transferring a pattern by using the above method (1) is preferable.

A method of producing a mold is not particularly limited. For example, to produce a mold having pyramid-shaped "projections" on its surface, a method of forming a metal layer by stacking a metal by a soldering method or a sputtering method, etc. on a substrate formed with a pyramid-shaped concave pattern, then, peeling the metal layer from the substrate may be mentioned.

To obtain a mold having pyramid-shaped "recesses" on its surface, a method of using a mold having pyramid-shaped projections obtained as above and performing mold release processing for bringing the mold surface into contact with potassium bichromate or other oxidizing agent, etc. in accordance with need, then, forming a metal layer by the same method as above by stacking metal, and peeling the metal layer from the mold may be mentioned.

A method of obtaining a substrate formed with a pyramid-shaped concave pattern is not particularly limited, and a method of using a property that a silicon single crystal substrate is anisotropically etched by an alkaline solution (etching solution) may be mentioned as a preferable example because a fine pattern is easily obtained. Specifically, this method is by (1) stacking an oxidized silicon film and a photo resist film on a silicon substrate in this order, then, forming a pattern on the photoresist film, (2) performing etching on the oxidized silicon layer by an etching solution containing hydrofluoric acid by using the resist pattern as a mask to form a silicon oxide pattern, (3) furthermore, performing anisotropic etching on the silicon substrate by a sodium hydroxide solution or other alkaline etching solution to form pyramid-shaped recesses on the silicon substrate (at this time, the resist pattern can be also removed at a time for it is soluble in the alkaline etching solution), and (4) bringing the finally left silicon oxide pattern into contact with an etching solution containing hydrofluoric acid to remove the silicon oxide pattern, projection or recesses (pattern) is formed on the surface of the silicon substrate.

When forming pyramid-shaped projections or recesses on a surface of a transparent base material film by using a mold produced by the above explained method, a width of a resist pattern to be a mask becomes a width "s" between adjacent projections or recesses on a lens array sheet of the present invention. The narrower the width "s" is, the more preferable. It is preferably 50% or less, more preferably 20% or less, further preferably 10% or less and particularly preferably 5% or less with respect to a length "a" of one side of the bottom surface of the pyramid shape.

Light Condensing Plate and Organic Electroluminescence Element

A light condensing plate of the present invention is made by the above lens array sheet.

An organic electroluminescence element of the present invention is obtained by stacking a transparent electrode layer, such as indium tin oxide (ITO), an organic electroluminescence material layer including an organic element, and a metal electrode layer in this order on the lens array sheet as a transparent substrate. In the organic electroluminescence element, the lens array sheet functions as a light condensing plate.

The organic electroluminescence element can be used as a backlight of a liquid crystal display device, etc.

EXAMPLES

Next, specific examples of the embodiment of the present invention will be taken to explain the present invention more in detail. Note that the present invention is not limited to the examples.

Example 1

Production of Substrate

After applying a positive type photoresist composition (product name: ZPP1700PG) made by ZEON Corporation by spin-coating on a substrate obtained by forming a film of $SiO_2$ to 300 Å on a silicon, the result was prebaked at 100° C. to obtain a resist film of 1.5 μm on the substrate.

The obtained resist film was subjected to exposure of 50 $mJ/cm^2$ by an exposure apparatus "PLA501F" made by Canon Inc. via a mask, development processing was performed by a 2.38% tetramethyl ammonium hydroxide solution for 60 seconds, and then, rinse processing by ultrapure water was performed for 30 seconds. The substrate was dried by spin processing and prebaking processing at 120° C. was finally performed to obtain a resist pattern on the substrate.

The thus obtained substrate was dipped in a hydrofluoric acid buffer solution (mixture of 3.6% hydrofluoric hydrofluoric water and 18% hydrofluoric ammonium water by 1:1 (in volume) at 20° C. It will be the same below.) for five minutes to etch $SiO_2$, rinsing processing for immersing the etched substrate in pure water for 60 seconds was performed, then, the substrate was dried by spin processing.

The substrate, wherein the oxide silicon film was etched, was immersed in a 30% sodium hydroxide solution for 30 minutes at 80°, immersed in pure water for 60 seconds, then, dried by blowing a dry air, so that pyramid-shaped concave recesses were formed on the silicon substrate.

To remove an excessive oxide silicon film remaining on the silicon substrate formed with the recesses, the substrate was dipped in a hydrofluoric acid buffer solution for 5 minutes, then, immersed in pure water for 60 seconds, and dried by blowing a dry air, so that a silicon substrate having pyramid-shaped recesses was produced.

Production of Mold

After adhering the obtained silicon substrate on a fixture and forming a nickel film of about 500 Å by vacuum evaporation on the surface, nickel metal was grown by performing electrolytic soldering in an electrolytic solution containing nickel sulfamate as its main component. The obtained nickel block (metal layer) was peeled from the silicon substrate, so that a mold (convex mold) formed with pyramid-shaped "projections" in a hound's-tooth check shape was produced.

Production of Lens Array Sheet

This mold was set in an injection molding apparatus to obtain a lens array sheet (the outside dimension is 40 mm×40 mm) having a thickness of about 1 mm by injection molding (resin melt temperature of 285° C., mold temperature of 130° C., and resin filling time of about 0.2 second) using a cycloolefin polymer (ZNR1430R made by ZEON Corporation).

The obtained lens array sheet was formed on its surface with pyramid-shaped "recesses" having a bottom surface of 20 μm×20 μm, a base angle of side surfaces of approximately 55° and a height of 14 μm in a hound's-tooth check shape.

Production of Organic Electroluminescence Element

ITO having a thickness of 300 Å was evaporated on the thus obtained lens array sheet, the result was washed with steam of IPA, set in an organic electroluminescence element producing apparatus, and subjected to plasma processing at 100 W under an atmosphere of oxygen/argon=50/50 for 5 minutes.

After that, the result was transferred to an organic evaporation chamber, and N,N-di(1-naphthyl)-N,N'-diphenyl-1,1'-diphenyl-1,4-imine (NPD) as a hole transport material and 8-hydroxy quinoline aluminum (Alq3) as an electron transport material were put in two melting pots wound by coil. Then, inside the chamber was depressurized to $10^{-6}$ Pa and a current of 20 A was applied to the coil holding NPD to perform evaporation until the film thickness becomes 400 Å, then, evaporation was performed under the same condition until a film thickness of Alq3 becomes 600 Å, so that an organic electroluminescence material layer was stacked.

After that, the substrate was moved to a metal evaporation chamber while keeping in the system in a vacuum state, and lithium fluoride loaded on a metal board was heated, so that the lithium fluoride was evaporated to be 5 Å on the organic layer. Then, aluminum was loaded on another metal board to evaporate it to be a thickness of 1000 Å by the same operation, so that a stacked body, wherein an ITO layer, an organic electroluminescence material layer and a metal electrode layer were stacked, was obtained on the lens array sheet.

The thus obtained stacked body was attached with a stainless sealing tube applied with an ultraviolet ray curing adhesion in a globe box in a dry nitrogen, and an ultraviolet ray was irradiated to adhere the sealing tube, consequently, an organic electroluminescence element was obtained.

Evaluation of Element

Measurement of luminance was made on the obtained element by a luminance measurement device (BM-8 made by TOPCON CORPORATION) in a state of being placed vertical with respect to the substrate surface, and the result was 2165 cd/cm². When luminance was measured in the same way in a state of giving a tilt by 45° with respect to the substrate surface respectively to above, below, right and left (evaluation of a viewable angle), the result was above: 2100 cd/cm², below: 2120 cd/cm², left: 2135 cd/cm² and right 2140 cd/cm². Namely, sufficient luminance was obtained even when viewing from the directions tilted by 45° with respect to the substrate surface, so that it was confirmed that a sufficient viewable angle was attained.

Comparative Example 1

Other than using a film of a cycloolefin polymer (ZNR1430R made by ZEON Corporation) having a thickness of 1 mm and not formed with concaves and convexes instead of the lens array sheet of the example 1, an organic electroluminescence element was produced in the same method as in the example 1, and the luminance was measured under the same condition. The result was 1250 cd/cm². Accordingly, it was confirmed that by using the lens array sheet of the example 1 as a light condensing plate, luminance of the organic electroluminescence element was improved to about 1.5 times.

Also, evaluation of the viewable angle measured in the same way was above: 1000 cd/cm², below: 955 cd/cm², left: 990 cd/cm² and right 930 cd/cm².

Example 2

The mold in the example 1 was used. The mold was immersed in a potassium bichromate solution (0.1 wt %) for 30 seconds and mold releasing processing was performed by oxidizing the mold surface, then, a nickel layer (metal layer) was stacked under the same condition as that in the example 1 and the stacked nickel layer was peeled from the mold, so that a mold (concave mold) formed with pyramid-shaped "recesses" having a base angle of side surfaces of approximately 55° and a height of 14 μm in a hound's-tooth check shape was obtained.

By using the obtained mold, a lens array sheet was produced in the same way as in the example 1. The obtained lens array sheet was formed on its surface with pyramid-shaped "projections" having a bottom surface of 20 μm×20 μm, a base angle of side surfaces of approximately 55° and a height of 14 μm in a hound's-tooth check shape.

By using the lens array sheet, an organic electroluminescence element was produced, and the luminance was measured under the same condition. The result was 1420 cd/cm². From the result, it was confirmed that luminance of the organic electroluminescence element was improved to about 1.7 times comparing with that in the comparative example 1 by using the lens array sheet of the example 2 as a light condensing plate.

Also, evaluation of the viewable angle measured in the same way was above: 1400 cd/cm², below: 1395 cd/cm², left: 1405 cd/cm² and right 1380 cd/cm², and superiority of the example 2 to the comparative example 1 was confirmed.

Analysis

The followings are understood from the examples 1, 2 and the comparative example 1 above. When using as a light condensing plate a lens array sheet formed with a plurality of projections or recesses on one surface of a transparent base material film, luminance of an organic electroluminescence element improves. Particularly, by choosing "recesses" from the projections and recesses to form, higher luminance is obtained.

A viewing angle was confirmed to have a tendency of becoming wider as the luminance improves.

INDUSTRIAL APPLICABILITY

A lens array sheet of the present invention exhibits remarkable efficiency in improving luminance as a light condensing plate of an organic electroluminescence element.

The lens array sheet of the present invention can be used as an optical part, such as an information recording medium, optical lens, optical filter, light guide plate for a liquid crystal display device and optical sheet, in addition to being used as a light condensing plate of an organic electroluminescence element.

The invention claimed is:

1. An organic electroluminescence element, comprising:
   a transparent substrate composed of a lens array sheet having a plurality of pyramid-shaped recesses on a surface of its transparent base material film,
   a transparent electrode layer stacked on the transparent substrate,
   an organic electroluminescence material layer stacked on the transparent electrode layer, and
   a metal electrode layer stacked on the organic electroluminescence material layer,
   wherein said transparent base material film is arranged so that a surface of said transparent base material film having pyramid-shaped recesses is most exterior surface of the layers comprising an organic electroluminescence element and
   a width "s" between adjacent recesses is more than 0% and not more than 50% of a length "a" of one side of the bottom surface of the recess.

2. The organic electroluminescence element as set forth in claim 1, wherein a bottom surface of the pyramid shape is a rectangular or square shape satisfying a relationship of (length "a" of one side)$\leq$(length "b" of other side)$\leq$10a.

3. The organic electroluminescence element as set forth in claim 2, wherein the length "a" of one side of the bottom surface of the pyramid shape is 0.1 µm to 20 µm.

4. The organic electroluminescence element as set forth in claim 3, wherein a height "c" of the pyramid shape is $0.2a \leq c \leq 2a$ with respect to the length "a".

5. The organic electroluminescence element as set forth in claim 1, wherein a base angle θ of side surfaces of the pyramid shape is 20° to 80°.

6. The organic electroluminescence element as set forth in claim 1, wherein the transparent base material film is composed substantially of an alicyclic olefin resin.

7. The organic electroluminescence element as set forth in claim 6, wherein the alicyclic olefin resin is a norbornene based polymer or a vinyl alicyclic hydrocarbon polymer.

8. The organic electroluminescence element as set forth in claim 1, wherein said lens array sheet is produced by injection molding using a mold having pyramid-shaped projections on its surface.

9. A display device comprising an organic electroluminescence element as set forth in claim 1.

* * * * *